(12) United States Patent
Kimura (10) Patent No.: US 8,384,481 B2
(45) Date of Patent: Feb. 26, 2013

(54) SIGNAL AMPLIFICATION DEVICE AND SIGNAL AMPLIFICATION METHOD (75) Inventor: Shigekazu Kimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 44 days.

(21) Appl. No.: 13/210,720

(22) Filed: Aug. 16, 2011

(65) Prior Publication Data

US 2012/0049962 A1    Mar. 1, 2012

(30) Foreign Application Priority Data

Aug. 30, 2010   (JP) ................... 2010-192056

(51) Int. Cl.
*H03F 3/68* (2006.01)
(52) U.S. Cl. .................... 330/295; 330/124 R
(58) Field of Classification Search .............. 330/295, 330/124 R, 84, 126
See application file for complete search history.

(56) References Cited

U.S. PATENT DOCUMENTS

| | | | |
|---|---|---|---|
| 6,861,907 B2 * | 3/2005 | Gotou | 330/295 |
| 7,711,331 B2 | 5/2010 | Takehara | |
| 7,750,740 B2 * | 7/2010 | Inoue | 330/295 |
| 2008/0303597 A1 * | 12/2008 | Inoue | 330/295 |
| 2011/0316633 A1 * | 12/2011 | Tadano | 330/295 |

FOREIGN PATENT DOCUMENTS

| | | |
|---|---|---|
| JP | 5-37263 | 2/1993 |
| JP | 2007-174148 | 7/2007 |
| JP | 2008-28509 | 2/2008 |
| JP | 2008-135829 | 6/2008 |
| JP | 2009-213090 | 9/2009 |

* cited by examiner

*Primary Examiner* — Henry Choe
(74) *Attorney, Agent, or Firm* — Fujitsu Patent Center (57) ABSTRACT

A signal amplification device includes: a signal generator which divides an input signal so as to generate a plurality of division signals having a specified amplitude and different phases; a plurality of amplifiers which amplify the plurality of division signals by using a field effect transistor, respectively; transmission lines through which the division signals pass, the division signals being amplified with individual amplifiers of the plurality of amplifiers, the transmission lines have different lengths and no isolation is provided between ends of the transmission lines; and a detector which performs a comparison between gate currents input to the individual amplifiers to detect whether an input of the division signal to any of the plurality of the amplifiers exceeds a saturation level.

7 Claims, 6 Drawing Sheets

SIGNAL AMPLIFICATION DEVICE AND SIGNAL AMPLIFICATION METHOD

CROSS-REFERENCE TO RELATED APPLICATION

This application is based upon and claims the benefit of priority of the prior Japanese Patent Application No. 2010-192056 filed on Aug. 30, 2010, the entire contents of which are incorporated herein by reference.

FIELD

The present disclosure relates to a signal amplification device, and particularly relates to a signal amplification device using a signal combiner with no isolation, and a method for amplifying a signal using the device.

BACKGROUND

The signal amplification device provided in a base station of a radio communication system may use a high-efficiency linear amplification circuit configured to amplify high frequency power to a high level. An example of a high-efficiency liner amplification circuit includes saturation amplifiers that are realized under the linear amplification with a nonlinear component (LINC) system and combined by a Chirex combiner or the like.

SUMMARY

A signal amplification device includes: a signal generator which divides an input signal so as to generate a plurality of division signals having a specified amplitude and different phases; a plurality of amplifiers which amplify the plurality of division signals by using a field effect transistor, respectively; transmission lines through which the division signals pass, the division signals being amplified with individual amplifiers of the plurality of amplifiers, the transmission lines have different lengths and no isolation is provided between ends of the transmission lines; and a detector which performs a comparison between gate currents input to the individual amplifiers to detect whether an input of the division signal to any of the plurality of the amplifiers exceeds a saturation level.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Input voltage to an amplification circuit, which uses the saturation amplifier according to the LINC system, is required to be near its saturation level. Therefore, the voltage of input signals may exceed the allowable voltage of the amplification circuit due to waveform of the signals. Consequently, a so-called excessive input may cause technical problems in that the amplification circuit may be destroyed or deteriorated. On the other hand, when the amplification circuit is designed to function at lower voltage levels in order to avoid the excessive input, it becomes difficult to operate the saturation amplifier with high-efficiency.

Accordingly, an amplification circuit configured to detect the excessive input current has been studied. In an amplification circuit achieved under the LINC system, a monitoring circuit is provided for each of amplifiers that are arranged in parallel. Therefore, it has been difficult to realize the LINC-system amplification circuit from the viewpoint of cost. Further, since the reference voltage of the LINC-system amplification circuit, which is used to detect the excessive input, should be highly accurate and stable, the difficulty of appropriately detecting the excessive input is increased.

In view of the above-described problems, the present disclosure has been achieved to provide a signal amplification device and a signal amplification method that allow for appropriately monitoring of an excessive current input to an amplifier. As such, the signal amplification device and the signal amplification method reduces the likelihood and/or prevents the amplification device from being destroyed or deteriorated from an excessive input.

A signal amplification device disclosed herein includes a signal generator, a plurality of amplifiers, transmission lines, and a detector. The signal generator divides an input signal into a plurality of division signals that have a specified amplitude and different phases. Each of the amplifiers amplifies the division signal using a field effect transistor (FET). The division signals are applied to a gate terminal. The transmission lines are provided so that signals that are amplified by the individual amplifiers pass respective transmission lines. The transmission lines have different lengths and no isolation is provided between the ends of the transmission lines. The detector is configured to compare the gate currents of the FETs of the amplifiers with one another to detect whether or not the excessive input of a division signal exceeding the saturation level occurs in any of the amplifiers.

The signal amplification device disclosed herein can detect an excessive division signal input to each of the amplifiers with high precision with a relatively simple configuration by monitoring a gate current input to the FET of each of the amplifiers. Consequently, the destruction or deterioration of the signal amplification device, which is caused by the excessive signal input, may be appropriately reduced.

Hereinafter, embodiments of the present disclosure will be described in detail with reference to the attached drawings.

(1) Exemplary Configuration

Figure 1:
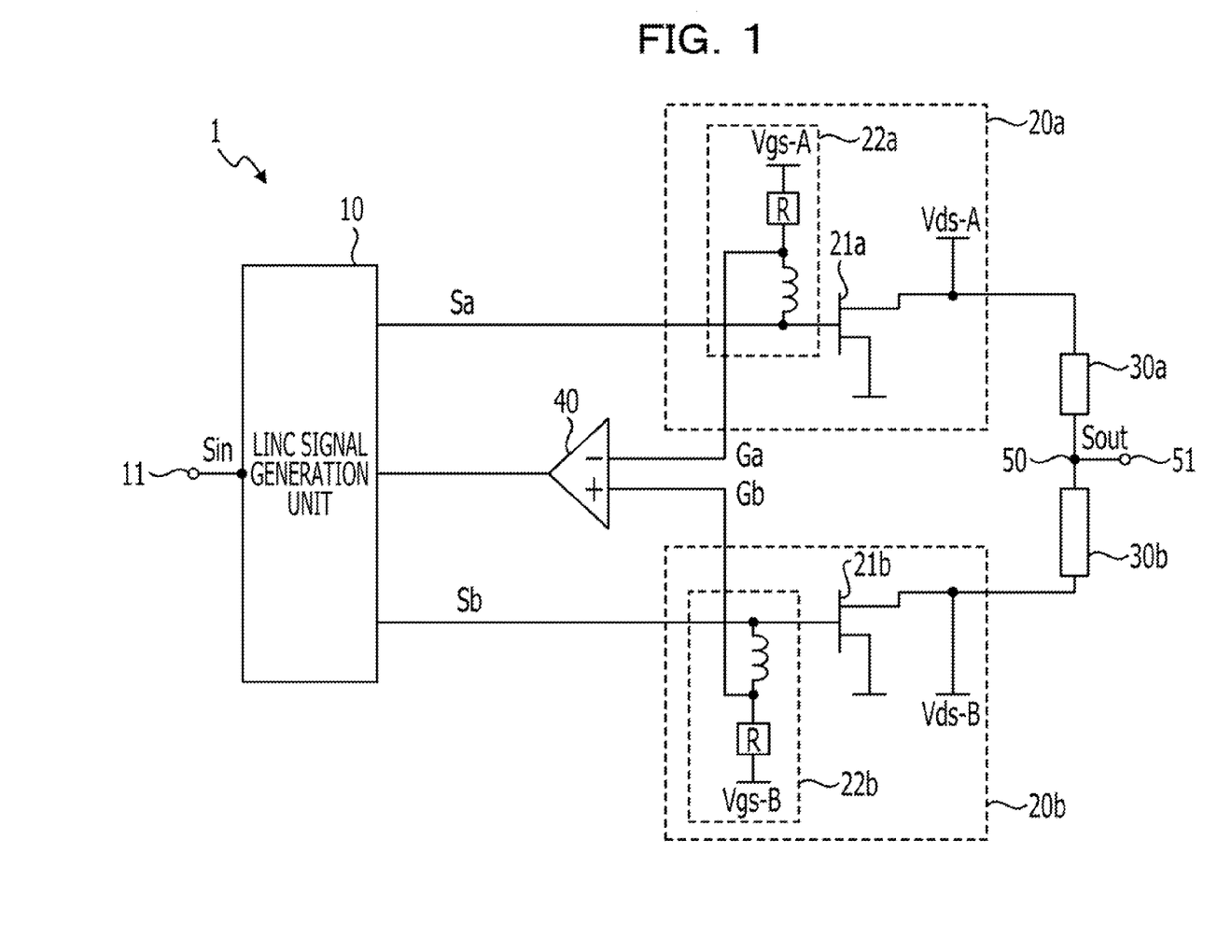
FIG. 1 illustrates the configuration of a LINC device.

The configuration of a LINC device 1, which is an embodiment of the disclosed signal amplification device, will be described with reference to FIG. 1. FIG. 1 illustrates the configuration of the LINC device 1 according to an embodiment.

As illustrated in FIG. 1, the LINC device 1 includes a LINC signal generation unit 10, amplifiers 20a and 20b, transmission lines 30a and 30b, a differential circuit 40, and a combining point 50.

The LINC signal generation unit 10 divides an input signal Sin input from an input terminal 11 into two signals Sa and Sb having amplitudes that are sufficiently similar to each other, where the amplitudes and the phases of the signals Sa and Sb in the combining vector are similar to those of the input signal Sin. Then, the LINC signal generation unit 10 outputs the signals Sa and Sb to the individual amplifiers 20a and 20b.

Here, the LINC signal generation unit 10 makes the phases of the signals Sa and Sb differ, the signals Sa and Sb being obtained through the division, based on the difference between the lengths of the transmission lines 30a and 30b that will be described later, that is, electrical lengths through which the signals Sa and Sb pass. Further, the LINC signal generation unit 10 makes FETs 21a and 21b that are provided in the individual amplifiers 20a and 20b operate within or near the saturation area regarding the amplitude of the individual signals Sa and Sb.

For example, the LINC signal generation unit 10 inputs an analog radio frequency (RF) signal, and divides the input signal Sin into the signals Sa and Sb. However, without being limited to the above-described embodiment, the LINC signal generation unit 10 may generate the signals Sa and Sb by performing digital signal processing or may perform further frequency conversion after performing frequency conversion to obtain an intermediate frequency (IF) signal.

The amplifier 20a includes the FET 21a and a gate current monitoring circuit 22a. The FET 21a performs a saturation operation to amplify the signal Sa input to the gate thereof, and outputs the signal Sa to a combining point 50 via the drain terminal and the transmission line 30a. The gate current monitoring circuit 22a inputs a gate current Ga which shall be input to the FET 21a to the opposite phase (negative) input terminal of the differential circuit 40.

The amplifier 20b includes the FET 21b and a gate current monitoring circuit 22b. The FET 21b performs a saturation operation to amplify the signal Sb input to the gate thereof, and outputs the signal Sb to the combining point 50 via the drain terminal and the transmission line 30b. The gate current monitoring circuit 22b inputs the gate current Gb of the FET 21b to the positive phase (positive) input terminal of the differential circuit 40. That is, the gate current monitoring circuit 22b inputs the gate current Gb of the FET 21b to the differential circuit 40, where the phase of the gate current Gb is opposite to that of the gate current Ga of the FET 21a.

Here, each of the amplifiers 20a and 20b may further include a matching circuit (not shown) configured to compensate for a parasitic element component by performing impedance matching. In that case, the length of each of the transmission lines 30a and 30b that will be described later may be determined in consideration of the electrical length of the matching circuit. The transmission line 30a connects the amplifier 20a to the combining point 50. The transmission line 30b connects the amplifier 20b to the combining point 50. The transmission lines 30a and 30b are designed to have different lengths, that is, different electrical lengths through which the individual signals Sa and Sb pass. In that case, the difference between the lengths of the transmission lines 30a and 30b may preferably be set to a value different from an integral multiple of the wavelengths of the signals Sa and Sb. That is, the signals Sa and Sb should be relatively different in phase based on the difference between the lengths of the transmission lines 30a and 30b.

Upon receiving the gate current Ga of the FET 21a and the gate current Gb of the FET 21b, the differential circuit 40 detects the difference between the gate currents Ga and Gb, and inputs information about the detection result to the LINC signal generation unit 10.

The combining point 50 is a combining point where the transmission lines 30a and 30b, and wiring extending to an output terminal 51 are combined. Here, the combining point 50 is arranged so that an output signal Sout having the same phase as that of the input signal Sin is generated when the signals Sa and Sb with different phases are combined. Here, the transmission lines 30a and 30b, the combination point 50, and the output terminal 51 that are described in the above-described embodiment constitute a so-called Chirex combiner. The Chirex combiner combines the signal Sa amplified with the FET 21a and the signal Sb amplified with the FET 21b at the combining point 50, and outputs the combined signals Sa and Sb from the output terminal 51 as an output signal Sout. Here, the Chirex combiner is designed not to have the so-called combiner's isolation, and includes a resistance element provided to absorb isolation, for example.

Each of the above-described configurations may be a different circuit or device so long as the different circuit or device can achieve the functions stated above. Further, each of the configurations may be provided as a combination of a plurality of circuits or devices.

(2) Exemplary Basic Operations

In the LINC device 1 according to an embodiment, the signals Sa and Sb that are generated from the input signal Sin are amplified with the individual FETs 21a and 21b, and are combined into the output signal Sout at the combining point 50. Consequently, it becomes possible to obtain a specified amplification effectiveness for the input signal Sin.

Figure 2:
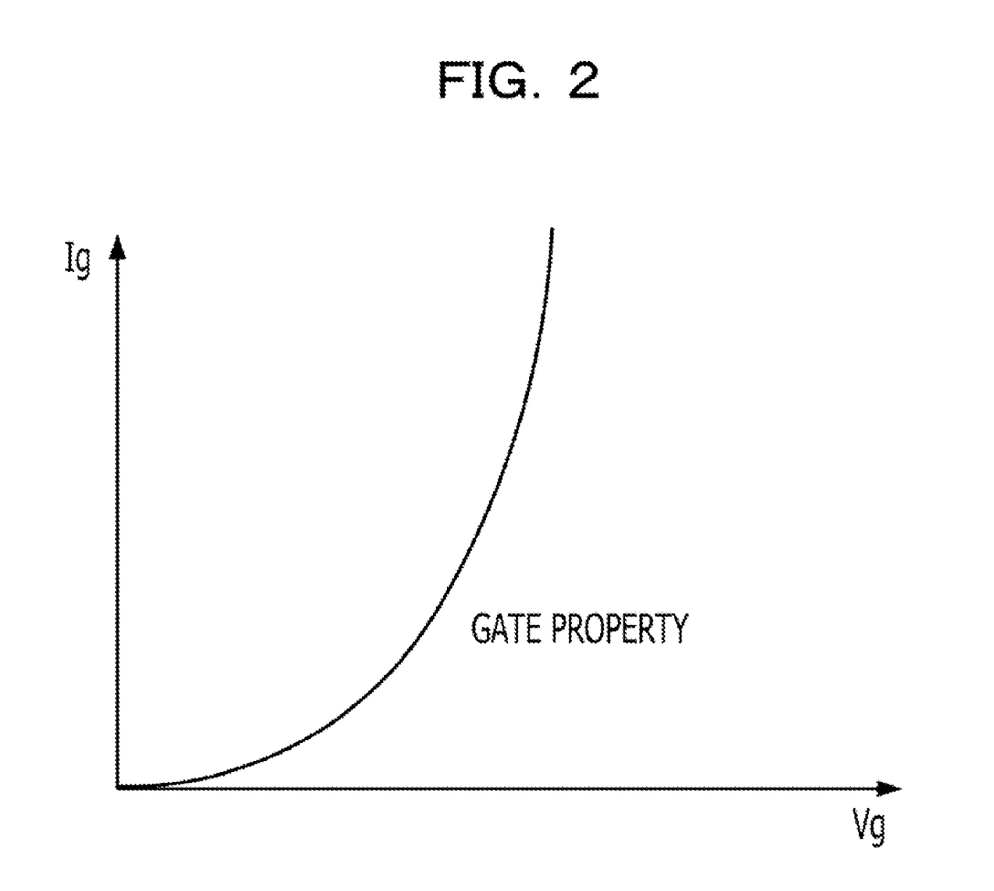
FIG. 2 is a graph illustrating a relationship between the gate current and the gate voltage of the FET in saturation operation.

In the LINC device 1 according to an embodiment, the differential circuit 40 receives the gate current Ga of the FET 21a and the gate current Gb of the FET 21b, and detects whether or not an excessive input occurs in each of the FETs 21a and 21b by making a comparison between the gate currents Ga and Gb. The FET has the gate property of carrying only a weak current as its gate current in a steady state, while carrying a rapidly increasing amount of current when the excessive input occurs. FIG. 2 illustrates an exemplary graph indicating the gate property of the FET where the horizontal axis represents a gate voltage Vg and the vertical axis represents a gate current Ig. Therefore, the gate currents Ga and Gb that are input to the differential circuit 40 are increased when the excessive input occurs in either of the FETs 21a and 21b.

In the LINC device 1 according to an embodiment, the length of the transmission line 30a connecting the FET 21a to the combining point 50 is different from that of the transmission line 30b connecting the FET 21b to the combining point 50 as stated above. Accordingly, the LINC signal generation unit 10 adjusts the signal Sa and Sb so that the phases thereof become different from each other based on the difference between impedances, the difference corresponding to that of the difference between the lengths of the transmission lines 30a and 30b. Consequently, the phases of the signals Sa and Sb that are generated with the LINC signal generation unit 10, and those of the gate currents Ga and Gb are different from one another.

There is a difference between the phases of the signals Sa and Sb that are input to the individual FETs 21a and 21b due to the mutual impedance difference caused by the difference between the lengths of the transmission lines 30a and 30b. Therefore, even though the signals Sa and Sb have the same amplitude, a shift occurs between the time when the excessive input occurs in the FET 21a and that when the excessive input occurs in the FET 21b. That is, in the FETs 21a and 21b, rapid increases in the gate currents, which are caused by the excessive inputs, do not occur simultaneously. The relationship between the phase difference between the gate currents Ga and Gb, and the excessive input occurrence time is illustrated in a graph of FIG. 3. The graph of FIG. 3 indicates the drain current (FET 21a: thin solid line, FET 21b: thin long dashed short dashed line) and the gate current (FET 21a: thick solid line, FET 21b: thick dotted line) of each of the FETs 20a and 20b.

Figure 3:
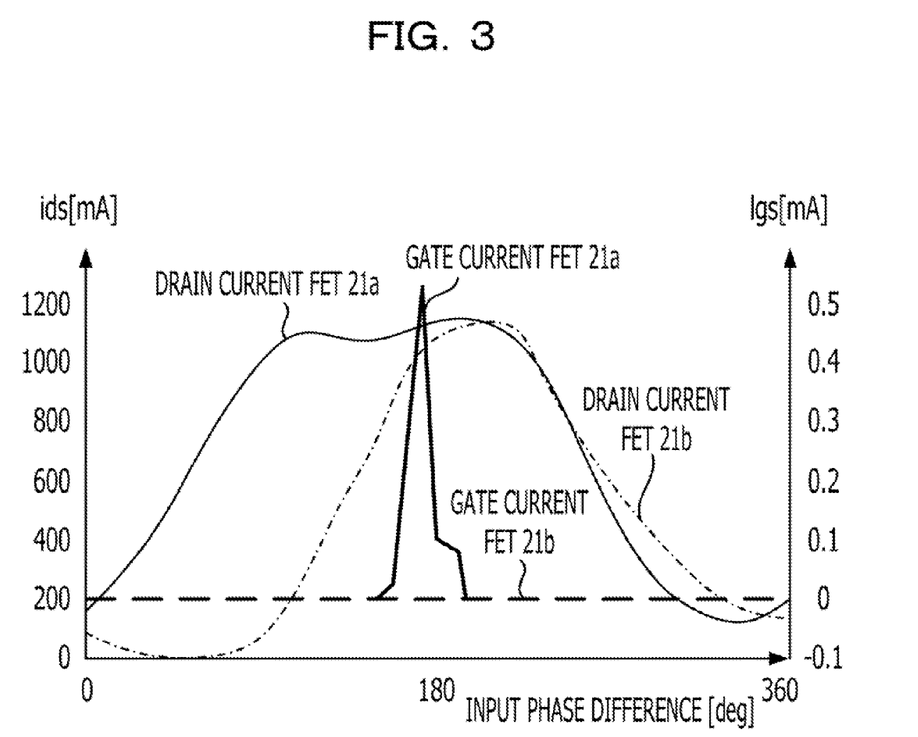
FIG. 3 is a graph illustrating the gate current of the FET in saturation operation.

FIG. 3 illustrates an example where the excessive input occurs for the FET 21a. Due to the excessive input to the FET 21a, a large amount of the gate current Ga passes through the FET 21a and a high peak occurs near a phase of 180 degrees. At that time, the large amount of gate current Ga is input to the differential circuit 40. On the other hand, no excessive input occurs for the FET 21b, and no peak occurs. Here, even though the excessive input occurs for the FET 21b, the phase of the gate current Gb is the same as that of the gate current Ga due to the phase difference. That is, no peak occurs when the excessive inputs occur at the same time.

When the excessive input occurs for either of the FETs 21a and 21b, either of the gate currents Ga and Gb that are input to the differential circuit 40, the gate current corresponding to the FET for which the excessive input occurs, is increased according to the above-described configuration. For example, the standard for the value of a steady-state gate current which is not in the saturation operation state is established for commercially available FETs. Therefore, when the excessive input occurs for either of the FETs 21a and 21b, one of the gate currents is increased due to the excessive input, and the other gate current has a current value stipulated by the standard. Consequently, detecting the voltage of a differential signal output from the differential circuit 40 allows for detecting that the excessive input occurs for either of the FETs 21a and 21b, and detecting the FET for which the excessive input occurs. As illustrated in FIG. 1, the differential circuit 40 outputs the difference between the input gate currents Ga and Gb. According to the example of FIG. 1, the FETs 21a and 21b are individually connected to the opposite phase input terminal and the positive phase input terminal of the differential circuit 40. Therefore, it becomes possible to determine from which of the FETs 21a and 21b the gate current increased in accordance with the excessive input is transmitted based on whether the output voltage is positive or negative.

Thus, the LINC device 1 according to an embodiment allows for detecting the excessive input occurring for each of FETs without providing an excessive input-detection circuit for each of the parallel FET amplifiers. Further, the LINC device 1 is configured to make a comparison between the gate currents of the adjacent FETs to determine a gate current which is significantly increased at the excessive input occurrence time. Therefore, even though a high-precision reference voltage is not provided, the excessive input can be appropriately detected. Here, even though the LINC device 1 includes the two FETs 21a and 21b according to the example described with reference to FIG. 1, the above-described embodiment may be applied for a LINC device including more than two FETs.

(3) First Exemplary Modification

Figure 4:
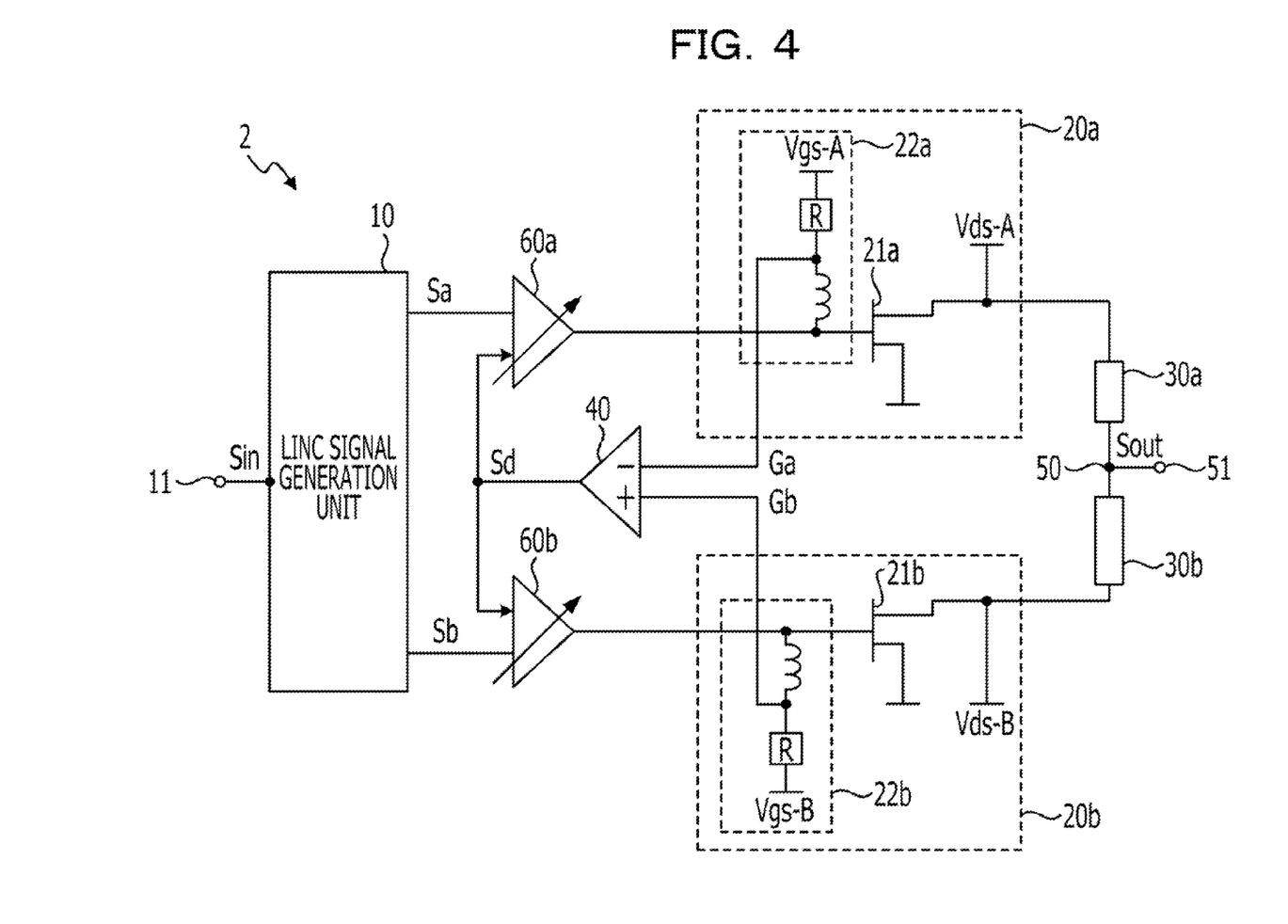
FIG. 4 illustrates the configuration of a first exemplary modification of the LINC device.

The configuration of a first exemplary modification of the disclosed signal amplification device, that is, a LINC device 2, will be described with reference to FIG. 4. In FIG. 4, the same configurations as those of FIG. 1 will be designated by the same reference numerals and the descriptions thereof will not be furnished.

As illustrated in FIG. 4, the LINC device 2 includes a variable amplifier 60a and a variable attenuator 60b that have mutually opposite properties. The variable amplifier 60a is provided at a position between the LINC signal generation unit 10 and the amplifier 20a, the position being defined on the transmission path of the signal Sa, and the variable attenuator 60b is provided at a position between the LINC signal generation unit 10 and the amplifier 20b, the position being defined on the transmission path of the signal Sb.

The variable amplifier 60a is configured to amplify the amplitude of a high-frequency electrical signal based on a specified variable amplitude. The variable amplifier 60a is connected to the differential circuit 40 and receives a difference signal Sd which is the difference between the gate currents Ga and Gb that are input to the differential circuit 40. The difference signal Sd has the amplitude, that is, the voltage corresponding to the difference between the voltages of the gate currents Ga and Gb that are input to the differential circuit 40. The variable amplifier 60a determines the amplification amplitude of the signal Sa based on the difference signal Sd input from the differential circuit 40.

More specifically, the variable amplifier 60a amplifies the amplitude of the signal Sa based on the voltage difference indicated by the difference signal Sd when the difference signal Sd input from the differential circuit 40 has a negative voltage, that is, when the voltage of the gate current Ga exceeds that of the gate current Gb. In other words, the variable amplifier 60a applies a negative amplitude indicated by the difference signal Sd to the signal Sa so that the amplitude of the signal Sa is amplified in a negative direction, that is, the amplitude of the signal Sa is attenuated. On the other hand, the variable amplifier 60a does not amplify the signal Sa when the difference signal Sd input from the differential circuit 40 has a positive voltage, that is, when the voltage of the gate current Ga is not more than that of the gate current Gb.

The variable attenuator 60b is configured to attenuate the amplitude of a high-frequency electrical signal based on a specified variable amplitude. The variable attenuator 60b is connected to the differential circuit 40, and receives the difference signal Sd corresponding to the difference between the gate currents Ga and Gb that are input to the differential circuit 40. The variable attenuator 60b determines the attenuation amplitude of the signal Sb based on the difference signal Sd input from the differential circuit 40.

More specifically, the variable attenuator 60b attenuates the amplitude of the signal Sb based on the voltage difference indicated by the difference signal Sd when the difference signal Sd input from the differential circuit 40 has a positive voltage, that is, when the voltage of the gate current Gb exceeds that of the gate current Ga. On the other hand, the variable attenuator 60b does not attenuate the signal Sb when the difference signal Sd input from the differential circuit 40 has a negative voltage, that is, when the voltage of the gate current Gb is not more than that of the gate current Ga.

Thus, when an excessive input occurs for the amplifier 20a in the above-described configuration, the variable amplifier 60a can attenuate the amplitude of the signal Sa based on the excessive input detected due to an increase in the gate current Ga. On the other hand, when an excessive input occurs for the amplifier 20b, the variable attenuator 60b can attenuate the amplitude of the signal Sb based on the excessive input detected due to an increase in the gate current Gb.

Consequently, a relatively simple configuration allows for decreasing the amplitude of the input signal Sin for an FET for which an excessive input occurs without using other control circuits or elements. Reducing the amplitude of the input signal Sin allows for reducing the excessive current input to each of the amplifiers 20a and 20b so that the likelihood of the LINC device 2 being destroyed or deteriorated is reduced and/or minimized.

(4) Second Exemplary Modification

Figure 5:
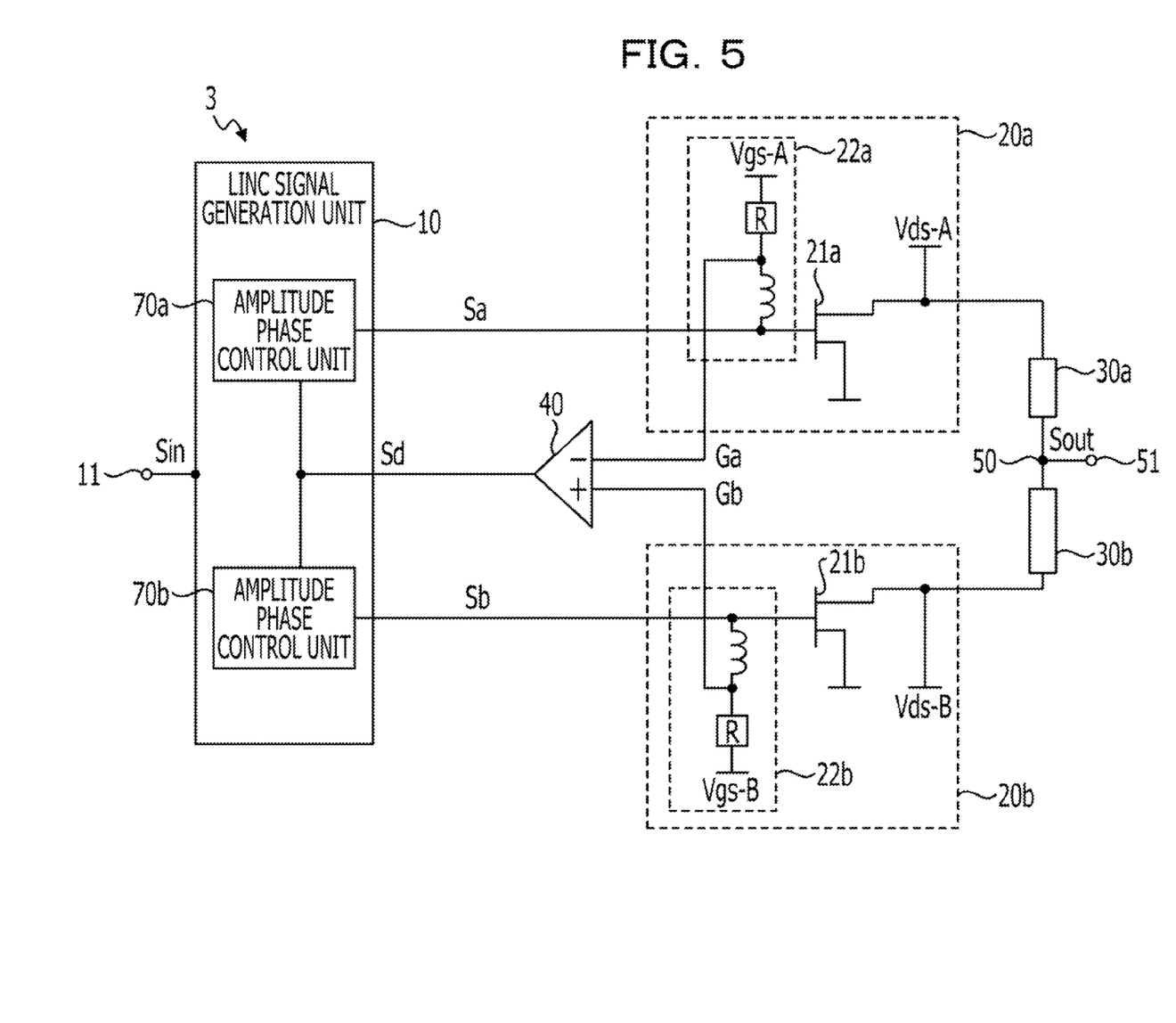
FIG. 5 illustrates the configuration of a second exemplary modification of the LINC device.

The configuration of a second exemplary modification of the disclosed signal amplification device, that is, a LINC device 3, will be described with reference to FIG. 5. In FIG. 5, the same configurations as those of FIG. 1 or FIG. 4 will be designated by the same reference numerals and the descriptions thereof will not be furnished.

As illustrated in FIG. 5, the LINC signal generation unit 10 of the LINC device 3 includes amplitude phase control units 70a and 70b that are configured to control the individual amplitudes and phases of the signals Sa and Sb that are obtained by dividing the input signal Sin.

The amplitude phase control units 70a and 70b are signal processing devices such as digital signal processors (DSPs) that are connected to the differential circuit 40a and that are configured to control the individual amplitudes and phases of the signals Sa and Sb based on signals that are input from the differential circuit 40. Each of FIGS. 6A and 6B illustrates exemplary amplitude control performed by the amplitude phase control units 70a and 70b.

Figure 6A:
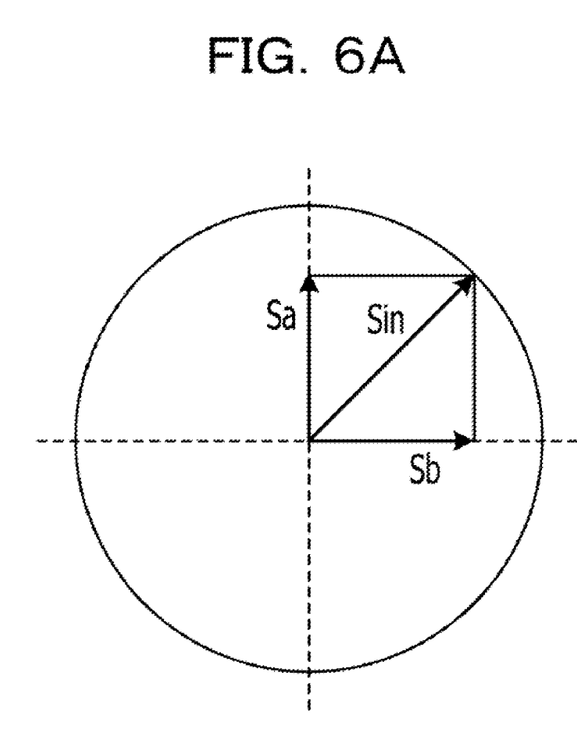
FIG. 6A is a diagram illustrating vector resolution.
Figure 6B:
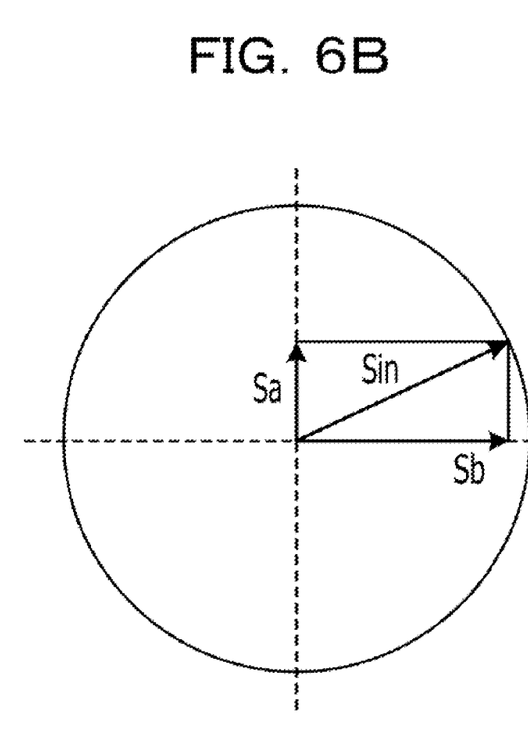
FIG. 6B is a diagram illustrating another vector resolution.

Each of FIGS. 6A and 6B illustrates how the input signal Sin input to the LINC signal generation unit 10 is divided into the signals Sa and Sb. Further, each of FIGS. 6A and 6B illustrates that the phase difference between the signals Sa and Sb is 90 degrees.

When no excessive input occurs in the LINC device 3, the LINC signal generation unit 10 breaks down the input signal Sin so that the amplitude of each of the signals Sa and Sb becomes constant as illustrated in FIG. 6A. Consequently, each of the FETs 21a and 21b is operated in a specified saturation state.

After that, when an excessive input of the signal Sa is detected from the FET 21a through an operation performed with the differential circuit 40, the amplitude phase control units 70a and 70b change the individual amplitudes of the signals Sa and Sb as illustrated in FIG. 6B. More specifically, the amplitude phase control unit 70a reduces the amplitude of the signal Sa based on the input level of a signal supplied from the differential circuit 40 so that the excessive signal Sa input to the FET 21a is eliminated. The amplitude phase control unit 70b increases the amplitude of the signal Sb so that compensation for the reduction in the amplitude of the signal Sa is provided, that is, the amplitude of a signal obtained by combining the changed signals Sa and Sb becomes the input signal Sin.

The above-described configuration allows for eliminating the excessive input to the FET so that a decrease in the power of the output signal Sout output from the LINC device 3 is minimized. Further, when an excessive input is detected from the FET 21b due to an increase in the amplitude of the signal Sb in the above-described embodiment, control may be performed to reduce the value of an increase in the amplitude of the signal Sb to a level where no excessive input occurs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A signal amplification device comprising:
    a signal generator which divides an input signal so as to generate a plurality of division signals having a specified amplitude and different phases;
    a plurality of amplifiers which amplify the plurality of division signals by using a field effect transistor, respectively;
    transmission lines through which the division signals pass, the division signals being amplified with individual amplifiers of the plurality of amplifiers, the transmission lines have different lengths and no isolation is provided between ends of the transmission lines; and
    a detector which performs a comparison between gate currents input to the individual amplifiers to detect whether an input of the division signal to any of the plurality of the amplifiers exceeds a saturation level.

2. The signal amplification device according to claim 1, further comprising:
    a corrector to reduce, when an excessive input occurs in any of the plurality of the amplifiers, an amplitude of the division signal to be input to the amplifier where the excessive input occurs, the corrector reduces the amplitume based on a difference between gate voltages that are input to the plurality of the amplifiers.

3. The signal amplification device according to claim 1, wherein the signal generator reduces an amplitude of the division signal to be input to the amplifier where an excessive input occurs based on a difference between gate voltages that are input to the plurality of the amplifiers.

4. The signal amplification device according to claim 3, wherein, in accordance with at least one of a difference of the gate voltage input to the plurality of the amplifiers and a reduction degree of the amplitude of the division signal input to the amplifier where the excessive input occurs, the signal generator increases an amplitude of the division signal to be input to the amplifier where the excessive input does not occur.

5. A signal amplification method comprising:
    comparing gate currents to be input to a plurality of amplifiers, respectively; and
    detecting, based on the comparison result, whether an input of a division signal to any of the plurality of the amplifiers exceeds a saturation level, the division signal being amplified with any of the plurality of the amplifiers through transmission lines having different lengths and no isolation between ends thereof.

6. The signal amplification device according to claim 1, wherein the transmission lines connect the plurality of the amplifiers to a combining point and combine the division signals that are amplified by the respective amplifiers.

7. The signal amplification device according to claim 6, wherein the lengths of the transmission lines extending from the plurality of the respective amplifiers to the combining point, are determined so that any of differences between electrical lengths extending from the amplifiers to the combining point does not become an integral multiple of a wavelength of the input signal.

* * * * *